United States Patent [19]

Schulze et al.

[11] Patent Number: 5,617,293

[45] Date of Patent: Apr. 1, 1997

[54] BRIDGE MODULE

[75] Inventors: Gerhard Schulze, Lippstadt; Reinhold Spanke, Bestwig; Karl-Heinz Sommer, Warstein, all of Germany

[73] Assignee: Siemens Aktiengesellschaft, Munich, Germany

[21] Appl. No.: 554,735

[22] Filed: Nov. 7, 1995

[30] Foreign Application Priority Data

Nov. 7, 1994 [DE] Germany ............ 44 39 632.5

[51] Int. Cl.⁶ ................................................ H05K 7/20
[52] U.S. Cl. ................ 361/715; 174/16.3; 257/678; 257/713; 257/724
[58] Field of Search .............. 174/16.3; 257/678, 257/686, 692, 706, 707, 712–713, 723, 724, 730; 361/679, 702, 704, 709–710, 713, 714–722, 728, 730, 736, 749, 777, 784

[56] References Cited

U.S. PATENT DOCUMENTS 4,965,710 10/1990 Pelly et al. ................ 361/709
5,457,604 10/1995 Ando ........................ 361/715

FOREIGN PATENT DOCUMENTS 0584668 8/1994 European Pat. Off. .

OTHER PUBLICATIONS

Patent Abstract of Japan No. JP 61–237461 (A), (Suzuki Oct. 22, 1986.
EUPEC Publ. No. 404WO7/90, 3 pages, IGBT–Modules.

*Primary Examiner*—Gregory D. Thompson
*Attorney, Agent, or Firm*—Herbert L. Lerner; Laurence A. Greenberg

[57] ABSTRACT

A bridge module includes at least two bridge branches. At least two respective controllable semiconductor switches are provided for each of the bridge branches. Electrically insulating and thermally conductive substrates have conductor tracks and are connected to a metal base plate. The semiconductor switches are electrically conductively mounted on the substrates. A housing has at least two AC terminals and four DC terminals. AC connection leads are connected to the AC terminals and to the semiconductor switches. DC connection leads are connected to the DC terminals and to the semiconductor switches. Each of the bridge branches has two of the DC connection leads and two of the DC terminals. All of the DC terminals of one and the same polarity are connectable to one another by leads being adjacent one another and disposed outside the housing.

5 Claims, 3 Drawing Sheets

BRIDGE MODULE

BACKGROUND OF THE INVENTION

FIELD OF THE INVENTION

The invention relates to a bridge module having at least two bridge branches, at least two controllable semiconductor switches per bridge branch, a metal base plate with which electrically insulating and thermally conductive substrates provided with conductor tracks are connected, the semiconductor switches being electrically conductively mounted on the substrates, a housing having at least two AC terminals and DC terminals, AC connection leads connected to the AC terminals and to the semiconductor switches, and DC connection leads connected to the DC terminals and to the semiconductor switches.

Such bridge modules, for instance for three phases, are available on the market. As an example, reference is made to the Eupec catalog entitled IGBT-Module [IGBT Modules], print number 404W07/90. In the modules shown therein, the DC terminals of one and the same polarity are united in the housing and each is connected through one connection lead to DC terminals mounted on the housing. The DC lines from the DC terminals to the individual bridge branches are of various lengths. That asymmetry within the module limits the usable current and voltage range of the semiconductor switches, since the properties of the module are determined by the bridge branch having the highest parasitic inductance.

SUMMARY OF THE INVENTION

It is accordingly an object of the invention to provide a bridge module, which overcomes the hereinafore-mentioned disadvantages of the heretofore-known devices of this general type and which improves electrical properties through the use of symmetry of construction.

With the foregoing and other objects in view there is provided, in accordance with the invention, a bridge module, comprising at least two bridge branches; at least two respective controllable semiconductor switches for each of the bridge branches; a metal base plate; electrically insulating and thermally conductive substrates having conductor tracks and being connected to the metal base plate, the semiconductor switches being electrically conductively mounted on the substrates; a housing having at least two AC terminals and four DC terminals; AC connection leads connected to the AC terminals and to the semiconductor switches; DC connection leads connected to the DC terminals and to the semiconductor switches; each of the bridge branches having two of the DC connection leads and two of the DC terminals; and leads being adjacent one another and disposed outside the housing for connecting all of the DC terminals of one and the same polarity to one another.

In accordance with another feature of the invention, the connection leads of each of the bridge branches are constructed in ribbon form, and the connection leads carrying forward and return current are each disposed close together.

In accordance with a further feature of the invention, the at least two bridge branches are three bridge branches.

In accordance with an added feature of the invention, the semiconductor switches are semiconductor components being connected parallel to one another.

In accordance with a concomitant feature of the invention, there are provided recovery diodes being connected antiparallel to the semiconductor switches.

Other features which are considered as characteristic for the invention are set forth in the appended claims.

Although the invention is illustrated and described herein as embodied in a bridge module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
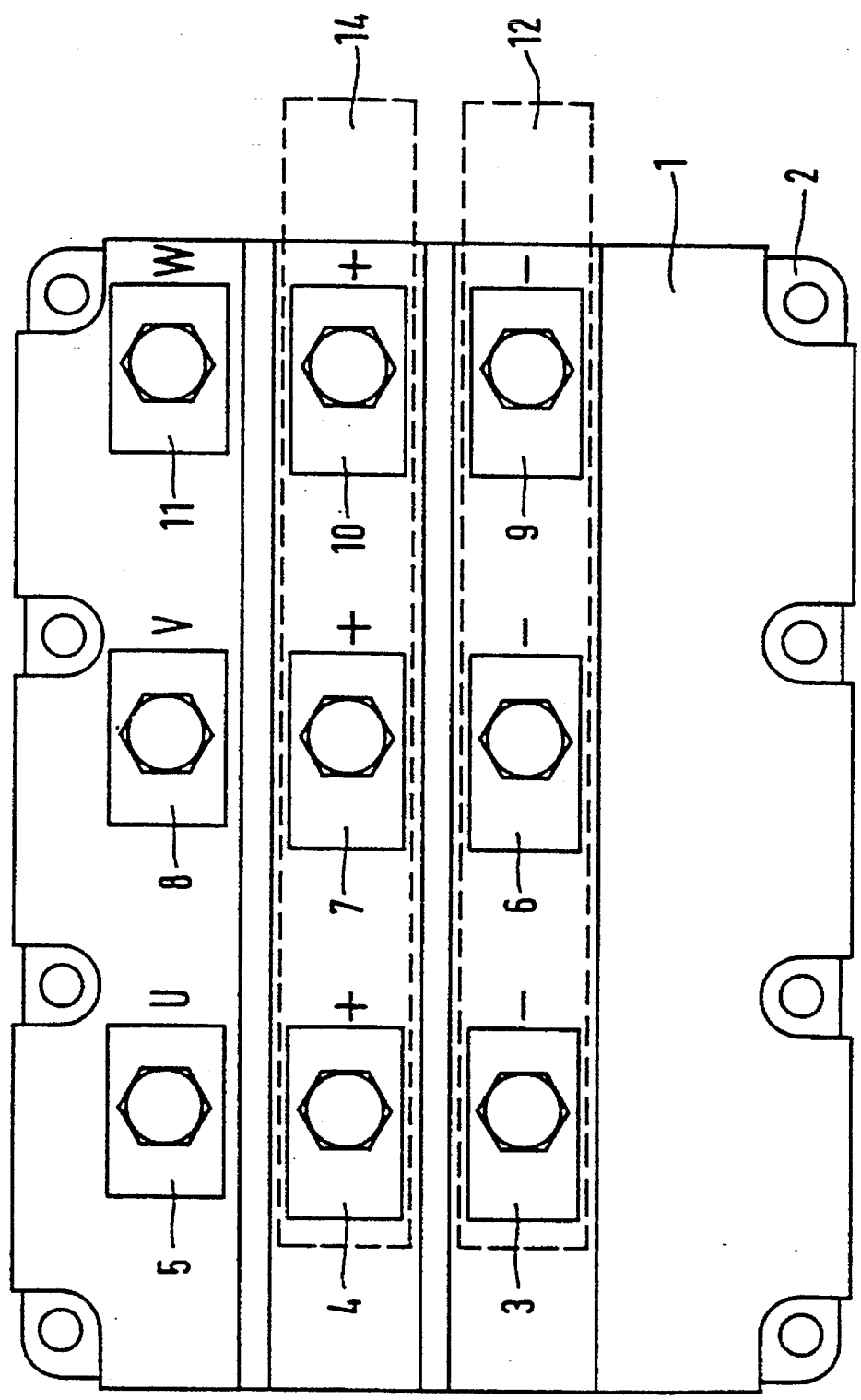
FIG. 1 is a diagrammatic plan view of a bridge module according to the invention.

Referring now to the figures of the drawing in detail and first, particularly, to FIG. 1 thereof, there is seen a bridge module which is enclosed in a housing 1 that is mounted on a metal base plate 2. A three-phase bridge having three power semiconductor branches, each with two semiconductor switches, is accommodated between the housing and the base plate. DC terminals of the bridge branches having negative polarity are identified by reference numerals 3, 6 and 9. DC terminals of the bridge branches having positive polarity are identified by reference numerals 4, 7 and 10. AC terminals for U, V and W phases are identified by reference numerals 5, 8 and 11. The AC terminals 5, 8 and 11 lead to center taps of the bridge branches in a known manner. The DC terminals are connected to the semiconductor switches through DC connection leads. Two of the DC terminals 4, 3; 7, 6; and 10, 9 are provided for each respective bridge branch. The DC terminals 3, 6 and 9 of negative polarity are electrically connected to one another through the use of a tab 12 located outside the housing. In the same way, the DC terminals 4, 7 and 10 are electrically connected to one another through the use of a tab 14 located outside the housing. This connection can be made either by the manufacturer or by the user. The two tabs 12, 14 for the direct current are disposed next to one another, and as a result, the inductance for the external DC circuit as well is kept low.

Figure 2:
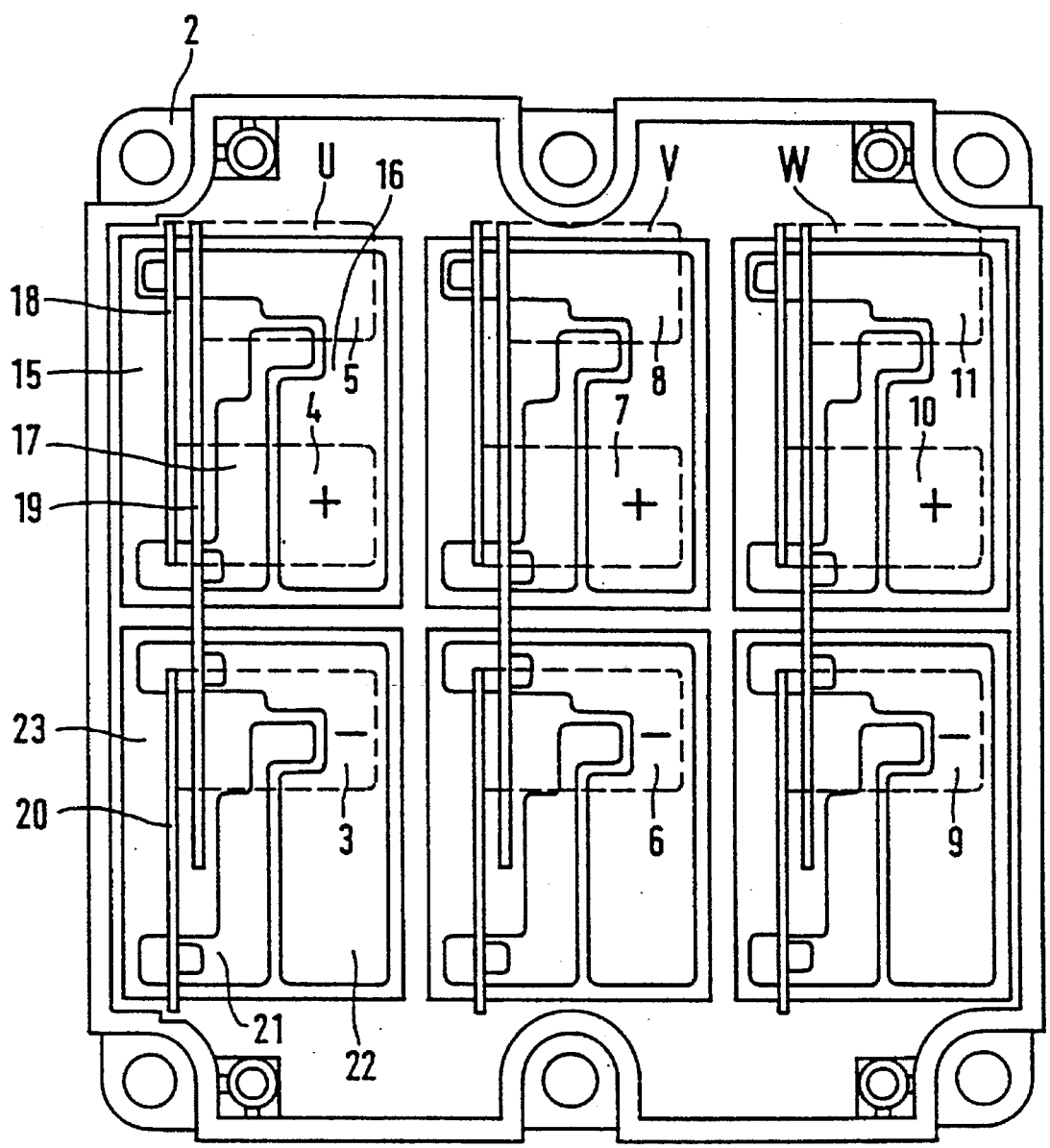
FIG. 2 is a plan view of an internal structure of the module of FIG. 1 in a simplified illustration.

The internal structure of the rectifier bridge module of FIG. 1 is shown in FIG. 2 on a different scale and in a simplified form. The structure will be explained only for the bridge branch of the U phase since the structure of the V and W phases is identical to that of the branch U.

Thermally conducting and electrically insulating substrates 15 and 23 are mounted on the metal base plate 2 for the U phase. They typically are formed of aluminum oxide $Al_2O_3$ or aluminum nitride AlN. The substrate 15 is provided on its surface with conductor tracks 16, 17. A first semiconductor switch which is disposed on the conductor track 16 may be an IGBT, for instance, which has a collector side being soldered to the substrate 16. An emitter side of the IGBT is connected to the conductor track 17, for instance through bonding wires.

The conductor track 16 is connected to a DC connection lead 18 and the conductor track 17 is connected to an AC connection lead 19. Outside the housing, the DC connection lead is connected to the DC terminal 4. The AC connection lead 19 is connected above the housing to the AC terminal 5. The terminals 4 and 5 are shown in dashed lines for the sake of simplicity.

Figure 3:
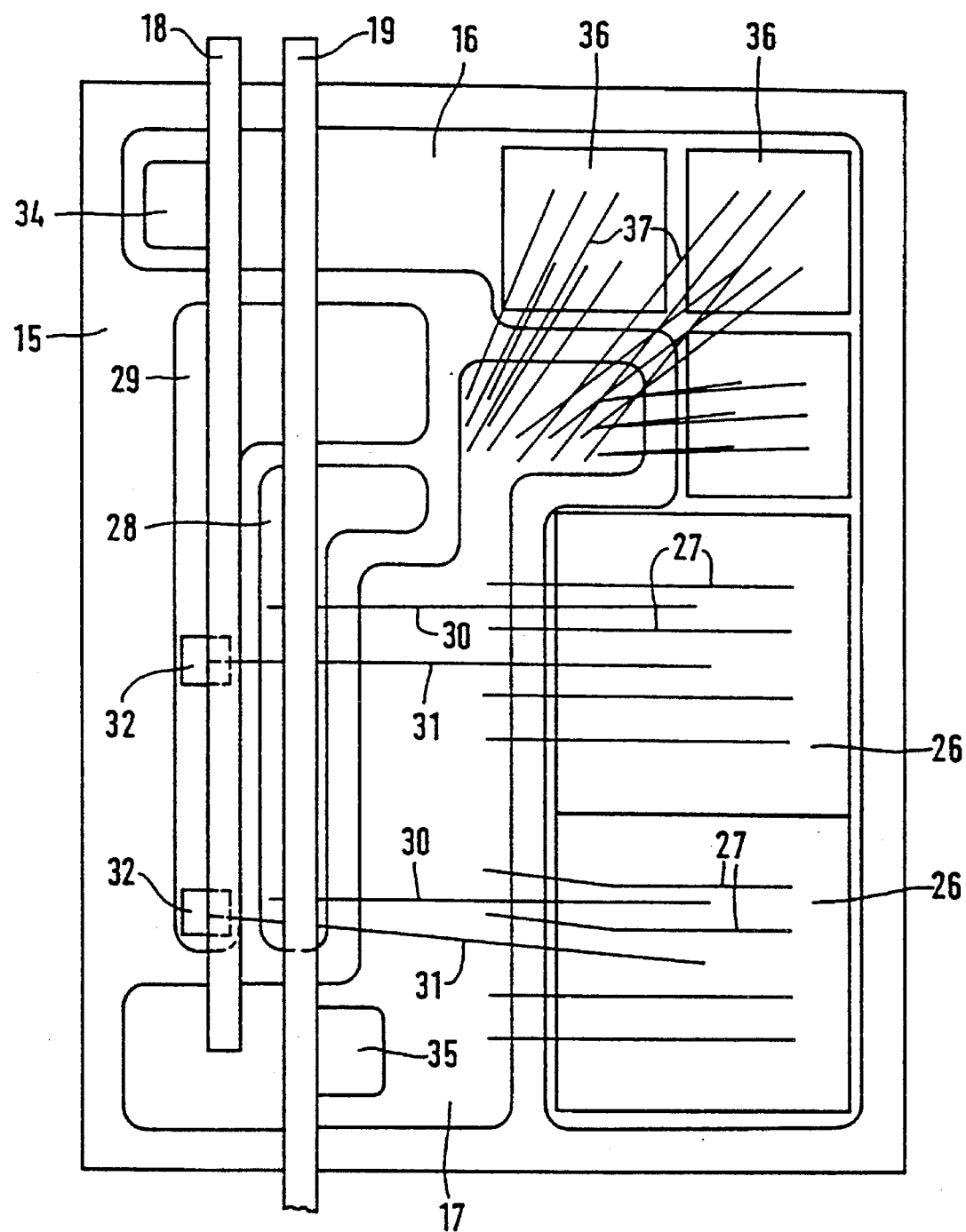
FIG. 3 is a plan view of a more-detail illustration of one semiconductor switch of the module.

The substrate 23 correspondingly carries conductor tracks 21 and 22. A second semiconductor switch of the bridge branch of the U phase is disposed on the conductor track 22. If the semiconductor switch is an IGBT, then it is likewise has a collector side being soldered to the conductor track 22. By way of example, an emitter side of the IGBT is again connected to the conductor track 21 through bonding wires. The conductor track 21 has a DC connection lead 20, which is connected on top of the housing to the DC connection lead 3. The conductor track 22 is connected to the AC connection lead 19. The semiconductor switches themselves, along with other conductor tracks and connecting leads that are necessary for triggering purposes, for instance, are not shown in FIG. 2. Reference is made to FIG. 3 therefor.

The semiconductor switch that is mounted on the substrate 15 is shown in detailed form in FIG. 3. In this case the semiconductor switch includes two semiconductor chips 26, for instance IGBTs, which have a collector side that is soldered to the conductor track 16. Emitter sides of the IGBTs are electrically connected to the conductor track 17 through bonding wires 27. Recovery diodes 36 are moreover also disposed on the conductor track 16, in such a way that their cathode terminal is soldered to the conductor track 16 and their anode terminal is connected to the conductor track 17 through bonding wires 37. The recovery diodes 36 are connected antiparallel to the IGBTs 26.

In addition to the conductor tracks 16, 17, other conductor tracks 28, 29 are present on the substrate 15. The conductor track 28 is connected through bonding wires 30 to the emitter contacts of the IGBTs 26 and it serves as an auxiliary emitter terminal. The conductor track 29 is connected through bonding wires 31 to gate terminals of the IGBTs. Resistors 32 can also be connected between the conductor track 29 and the bonding wires 31 and they serve in a known manner to make the turn-on of the IGBTs uniform.

The DC connection lead 18 is connected to the conductor track 16 through a foot 34, and the AC connection lead 19 is connected to the conductor track 17 through a foot 35. The conductor tracks 28 and 29 are likewise connected to the exterior of the housing through connection leads. These connection leads have been left out of the drawing for the sake of simplicity.

The lower semiconductor switch of the bridge branch U is identically structured. It has therefore not been shown or described separately.

In order to improve the electrical properties, those connection leads to each semiconductor switch that carry the forward and return current (load current) are constructed in ribbon form and are disposed close together or tightly packed. In the configuration of FIG. 2, these are the connection leads 18 and 19 for the upper bridge branch and the connection leads 20 and 19 for the lower bridge branch.

The invention has been described in terms of a three-phase bridge. Naturally, the invention is also conceivable for a single-phase bridge. Instead of the parallel circuits of two IGBTs described in the exemplary embodiment, three or more IGBTs may also be connected in parallel, given a suitable construction of the conductor tracks. Power MOSFETs may also be used instead of the IGBTs. The invention is also equally applicable to both inverting rectifier and rectifier modules.

We claim:

1. A bridge module, comprising:

at least two bridge branches;

at least two respective controllable semiconductor switches for each of said bridge branches;

a metal base plate;

electrically insulating and thermally conductive substrates having conductor tracks and being connected to said metal base plate, said semiconductor switches being electrically conductively mounted on said substrates;

a housing having at least two AC terminals and four DC terminals, said housing being attached to said metal base plate and enclosing said substrates and said semiconductor switches;

AC connection leads electrically connected to said AC terminals and to said semiconductor switches inside said housing;

DC connection leads electrically connected to said DC terminals and to said semiconductor switches inside said housing;

each of said bridge branches having two of said DC connection leads and two of said DC terminals; and mutually adjacent leads disposed outside said housing, a first one of said adjacent leads electrically connecting all of said DC terminals of one polarity to one another and a second one of said adjacent leads electrically connecting all of said DC terminals of a respectively opposite polarity to one another.

2. The bridge module according to claim 1, wherein said connection leads of each of said bridge branches are constructed in ribbon form, and said connection leads carrying forward and return current are each disposed close together.

3. The bridge module according to claim 1, wherein said at least two bridge branches are two of three bridge branches.

4. The bridge module according to claim 1, wherein said semiconductor switches are semiconductor components being connected parallel to one another.

5. The bridge module according to claim 1, including recovery diodes mounted on said substrates and connected antiparallel to said semiconductor switches.

* * * * *

UNITED STATES PATENT AND TRADEMARK OFFICE
CERTIFICATE OF CORRECTION

PATENT NO. : 5,617,293
DATED      : April 1, 1997
INVENTOR(S): Gerhard Schulze, et. al.

It is certified that error appears in the above-identified patent and that said Letters Patent is hereby corrected as shown below:

Title page, Item (73) should read as follows:

Assignee: EUPEC EUROPAEISCHE GESELLSCHAFT FUER
                 LEISTUNGSHALBLEITER MBH & CO.KG Signed and Sealed this Second Day of June, 1998

*Attest:*

BRUCE LEHMAN

*Attesting Officer*     *Commissioner of Patents and Trademarks*